Figure 1:
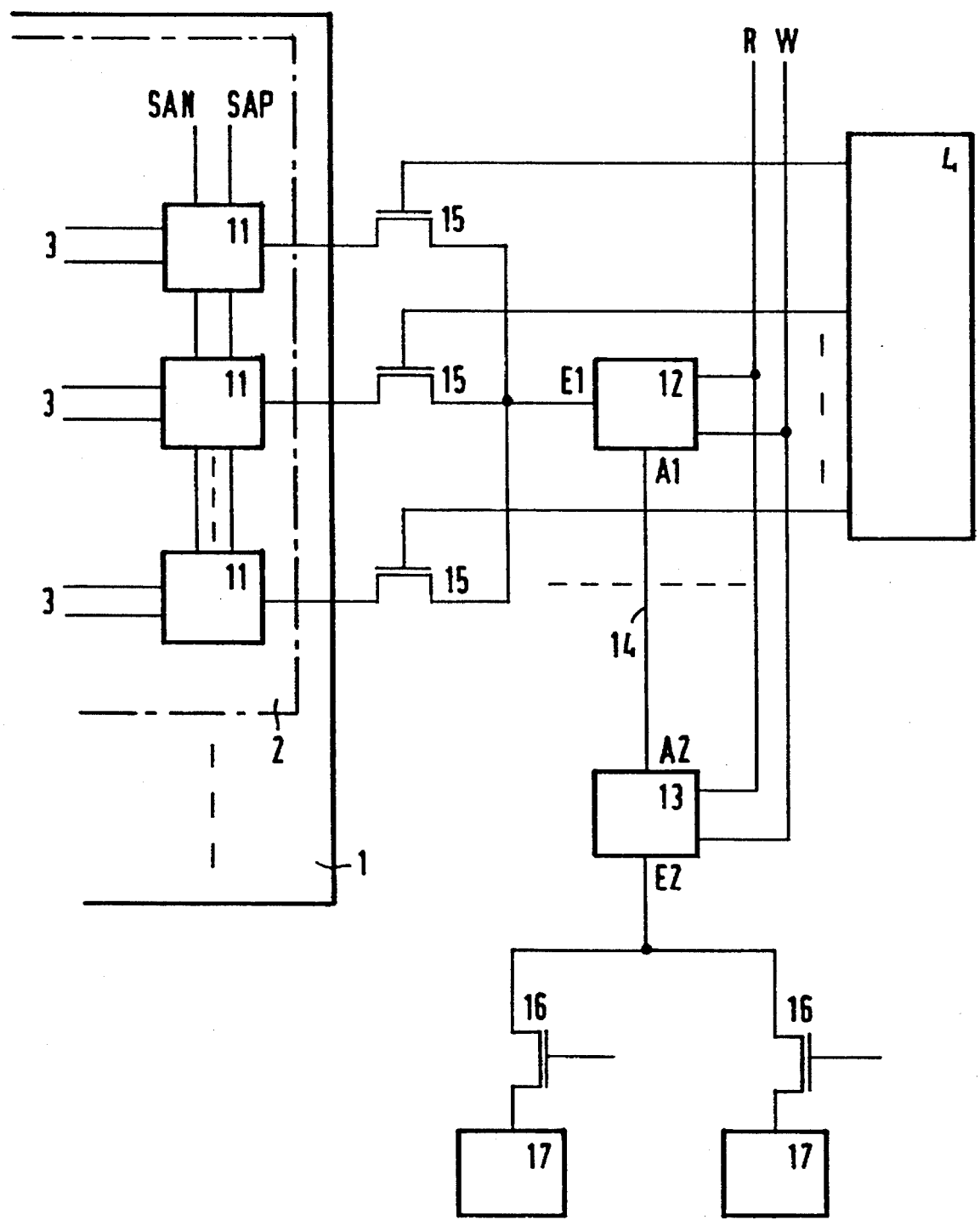

United States Patent [19]

Meyer et al.

[11] Patent Number: 5,537,352

[45] Date of Patent: Jul. 16, 1996

[54] INTEGRATED SEMICONDUCTOR MEMORY CONFIGURATION

[75] Inventors: Willibald Meyer, München; Norbert Wirth, Unterschleissheim, both of Germany

[73] Assignee: Siemens Aktiengesellschaft, Munich, Germany

[21] Appl. No.: 339,515

[22] Filed: Nov. 14, 1994

Related U.S. Application Data

[63] Continuation of Ser. No. 97,128, Jul. 26, 1993, abandoned.

[30] Foreign Application Priority Data

Jul. 24, 1992 [EP] European Pat. Off. .............. 92112720

[51] Int. Cl.$^6$ .................................................... G11C 7/00
[52] U.S. Cl. ................ 365/189.02; 365/189.05; 365/230.03
[58] Field of Search ..................................... 365/190, 207, 365/230.5, 230.9, 205, 230.3, 189.1, 189.5, 189.2, 189.01, 189.02, 230.03, 208, 189.05, 191

[56] References Cited

U.S. PATENT DOCUMENTS

| | | | |
|---|---|---|---|
| 4,539,658 | 9/1985 | Shimohigashi | 365/207 |
| 4,855,957 | 8/1989 | Nogami | 365/189.5 X |
| 4,855,959 | 8/1989 | Kobayashi | 365/230.5 X |
| 4,891,792 | 1/1990 | Hanamura | 365/189.5 |
| 5,022,007 | 6/1991 | Arimoto | 365/190 X |
| 5,025,421 | 6/1991 | Cho | 365/230.5 |
| 5,136,543 | 8/1992 | Matsuda | 365/190 |
| 5,233,558 | 8/1993 | Fujii | 365/189.01 |
| 5,235,547 | 8/1993 | Kobayashi | 365/190 |
| 5,274,595 | 12/1993 | Seok | 365/189.1 X |
| 5,311,469 | 5/1994 | Hoshi | 365/189.05 |
| 5,323,345 | 6/1994 | Ohsawa | 365/189.01 |

FOREIGN PATENT DOCUMENTS

| | | |
|---|---|---|
| 0481084 | 4/1992 | European Pat. Off. . |
| 41138102 | 5/1992 | Germany . |

OTHER PUBLICATIONS

"A 50-μ A Standby 1M×11 256μ×4 CMOS DRAM with High-Speed Sense Amplifier", Fujii et al, IEEE Journal of Solid State Circuits, Oct. 1986 No. 5, pp. 643–648.

"A 20-ns 256μ×4 Fifo Memory" Hashimoto et al, IEEE Journal of Solid-State Circuits, vol. 23, No. 2, Apr. 1988, pp. 490–499.

"100-MHz Serial Access Architecture for 4-Mb Field Memory" Miyauchi et al, IEEE Journal of Solid-State Circuits, vol. 26, No. 4, Apr. 1991, pp. 555–558.

"A Triple-Port Field Memory for Digital Video Processing" IEEE Transactions on Consumer Electronics, vol. 37, No. 3, Aug. 1991.

Primary Examiner—David C. Nelms
Assistant Examiner—Son Mai
Attorney, Agent, or Firm—Herbert L. Lerner; Laurence A. Greenberg

[57] ABSTRACT

An integrated semiconductor memory configuration includes a memory region having a plurality of segments. Each of the memory region segments have a plurality of read amplifiers and bit lines. Each two of the bit lines are connected to a respective one of the read amplifiers. A plurality of parallel data lines lead to the memory region. Each of the data lines have an end oriented toward and another end oriented away from a respective one of the memory region segments. Each of a plurality of read/write amplifier switches is disposed at one of the ends of the respective data lines. Each of a plurality of selector switches connects the read/write amplifier switch disposed on the end of a respective one of the data lines oriented toward the memory region segment to a respective one of the read amplifiers of the memory region segment.

6 Claims, 3 Drawing Sheets

INTEGRATED SEMICONDUCTOR MEMORY CONFIGURATION

This application is a continuation of application Ser. No. 08/097,128, filed Jul. 26, 1993, now abandoned.

BACKGROUND OF THE INVENTION

1. Field of the Invention

In semiconductor memory arrays in which further circuits are also integrated on the same chip in addition to the actual memory region, such as in picture memories, there is a demand for ever-increasing data rates and/or a greater number of circuits for further processing data on the same chip. Since the speed of access to the memory region, which is usually constructed as a DRAM, cannot be increased at will, more and more bits must be transmitted simultaneously and parallel to or from the memory region upon each access.

Conventional standard DRAMs today operate with up to 16 internal, parallel double data lines. One such double data line includes two parallel data lines, with each of the two carrying a signal complementary to that of the other data line. This provision makes it possible to attain a fast switching time for the read amplifiers and therefore a shorter signal transit time from the actual memory region to the data accesses of a memory array.

However, picture memories should offer blocks of up to 32×9=288 bits simultaneously with random access from or to a 4 Mb cell field, to or from a plurality of data accesses with buffer memories and shift registers. If a double data line including two data lines were used, that would mean 576 parallel lines for the example given.

It is accordingly an object of the invention to provide an integrated semiconductor memory array, which overcomes the hereinafore-mentioned disadvantages of the heretofore-known devices of this general type and which reduces the number of necessary lines at a high data rate.

With the foregoing and other objects in view there is provided, in accordance with the invention, an integrated semiconductor memory array, comprising a memory region having a plurality of segments, each of the memory region segments having a plurality of read amplifiers, and bit lines, each two of the bit lines being connected to a respective one of the read amplifiers; a plurality of parallel data lines leading to the memory region, each of the data lines having an end oriented toward and another end oriented away from, a respective one of the memory region segments; read/write amplifier switches each being disposed at a different one of the ends of a respective one of the data lines; and selector switches each connecting the read/write amplifier switch disposed on the end of a respective one of the data lines oriented toward the memory region segment to a respective one of the read amplifiers of the memory region segment.

Accordingly, in the integrated semiconductor memory array according to the invention, only a single data line is used instead of a double data line, with read/write amplifier switches disposed at both ends of this data line. Since the length of these data lines is often considerable, and they furthermore have an extensive capacitance coating, the signals to be transmitted subsequently must be amplified before being transmitted. Since these data lines are used bidirectionally, amplifiers are necessary on both ends of the data lines, with one of the amplifiers being used for the reading mode and the other for the writing mode of the memory array. Besides the amplifiers, switches are also provided, in the read/write amplifier switches, with the aid of which the signals in the operating mode for which the amplifiers are not intended are made to bypass the amplifiers.

In accordance with another feature of the invention, the read/write amplifier switches disposed on the end of the data lines oriented away from the memory region are connected to one or more circuit configurations, and when there are a plurality of circuit configurations for further processing data, these configurations are connected through selector switches to the various read/write amplifier switches.

In accordance with a further feature of the invention, the circuit configurations for further processing data are constructed as buffer memories or shift registers or data input/output circuits. However, other circuit configurations are also conceivable.

Since two bit lines each with complementary information are present inside the memory region, these bit lines may be reduced to one data line in either the read amplifiers or the read/write amplifier switches. In accordance with a concomitant feature of the invention, the read/write amplifier switches are thus connected through either one or two connecting lines with the applicable memory region segments and with the circuit configurations for further processing data.

Other features which are considered as characteristic for the invention are set forth in the appended claims.

Although the invention is illustrated and described herein as embodied in an integrated semiconductor memory array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 2:
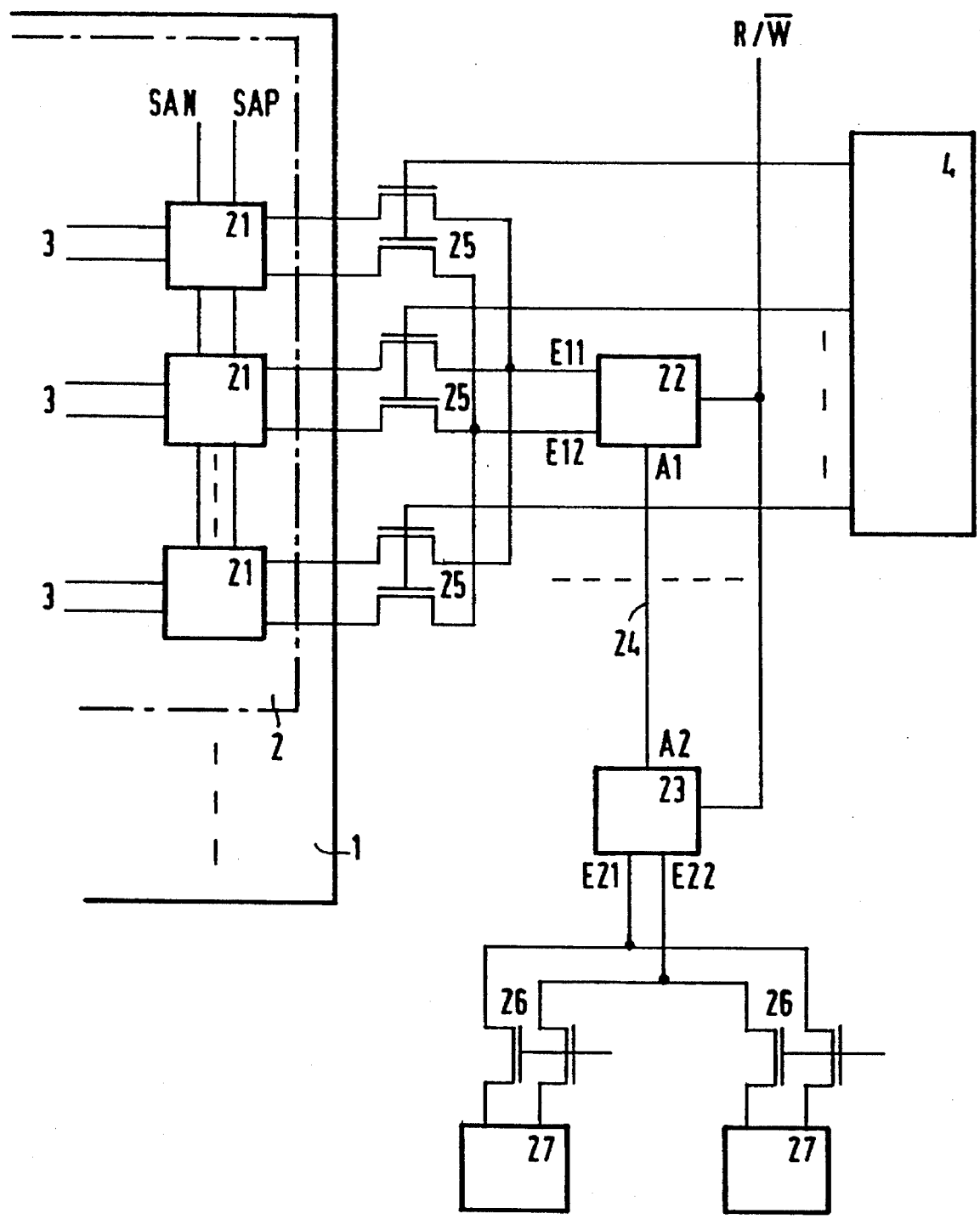

FIGS. 1 and 2 are block circuit diagrams of possible embodiments of parts of semiconductor memory arrays according to the invention; and FIGS. 3–6 are schematic circuit diagrams of possible embodiments of read/write amplifier switches.

Referring now to the figures of the drawing in detail and first, particularly, to FIG. 1 thereof, there is seen a memory region 1 of an integrated semiconductor memory array according to the invention which is subdivided into a number of memory region segments 2. Each such segment 2 is assigned a plurality of read amplifiers 11, which in turn each supply two bit lines 3. The read amplifiers 11 are activated over two lines at a time by means of two signals SAN and SAP.

The read amplifiers 11 of each memory region segment 2 are connected through selector switches 15 to an input E1 of a first read/write amplifier switch 12, and these selector switches 15 are triggered by a one-out-of-N bit decoder 4. An output A1 of the first read/write amplifier switch 12 is connected over a data line 14 to an output A2 of a second read/write amplifier switch 13, having an input E2 which in turn is connected through selector switches 16 to circuit configurations 17 for further processing data. The selector switches 16 are likewise triggered by a non-illustrated one-out-of-N bit decoder. The circuit configurations 17 may, for example, be shift registers, buffer memories or data input/output circuits. Both the first and the second read/write amplifier switches 12, 13 are acted upon through the use of two lines by a read signal R and a write signal W, depending on whether reading or writing is to be done.

FIG. 2 shows a second embodiment of an integrated semiconductor memory array according to the invention, which differs from the embodiment of FIG. 1 substantially in that the two bit lines 3 supplied by one read amplifier 21 are not reduced to one data line in the read amplifier 21 itself. Instead, the two bit lines 3 are not reduced to one data line 24 until inside a first read/write amplifier switch 22. The individual read amplifiers 21 of a memory region segment 2 are accordingly each connected through two selector switches 25 to inputs E11, E12 of the read/write amplifier switch 22. The selector switches 25 in turn are triggered by a one-out-of-N bit decoder 4. A second read/write amplifier switch 23 also has two inputs E21, E22 which are each connected through two selector switches 26 to various circuit configurations 27 for further processing data.

Additionally, in the embodiment of FIG. 2, in contrast to that of FIG. 1, the two read/write amplifier switches 22, 23 are activated by a read/not write signal R/$\overline{W}$.

In FIGS. 3–6, various embodiments of read/write amplifier switches 12, 13 and 22, 23 are shown.

Figure 3:
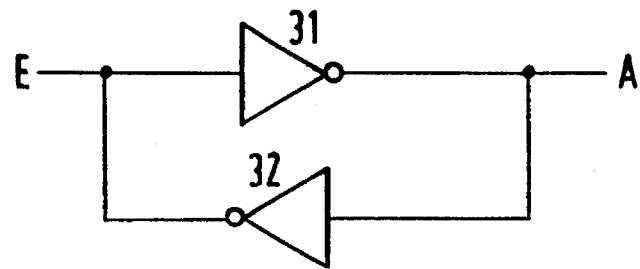

Thus FIG. 3 shows a read/write amplifier switch in which a second amplifier 32 is connected parallel to but in the opposite direction from, a first amplifier 31, which has an input E and an output A. In this read/write amplifier switch, no read signal R or write signal W is necessary, since both amplifiers 31, 32 are unidirectional, and due to the configuration thereof itself, act as switches for the particular transmission direction.

If so-called tri-state buffers are used instead of the amplifiers 31, 32 shown in FIG. 3, then they can be switched into a high-impedance state by means of the read signal R or the write signal W. Tri-state buffers may be used either for the amplifier 31 or the amplifier 32, or for both amplifiers 31 and 32.

Figure 4:
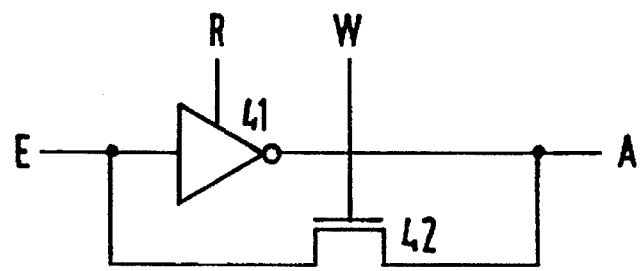

FIG. 4 shows a read/write amplifier switch, in which an n-channel FET switch 42, which is triggered by a write signal W, is connected parallel to a tri-state buffer 41, which is activated by a read signal R and has an input E and an output A.

Figure 5:
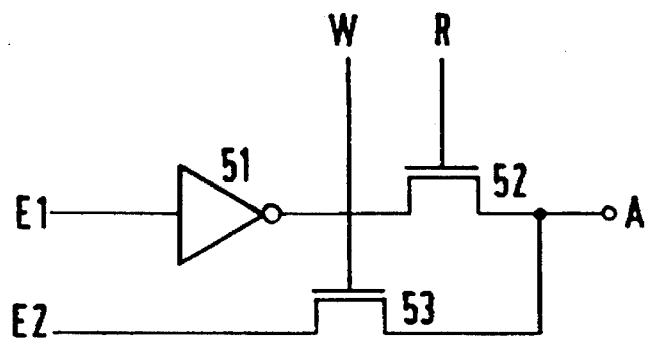

If only one amplifier 51 is used instead of the tri-state buffer 41 as is shown in FIG. 5, then it is advantageous to connect one further n-channel FET switch 52 in series with it, and then this switch 52, instead of the tri-state buffer 41, is triggered by the read signal R.

As FIG. 5 shows, the input E1 of the amplifier 51 is not connected to one terminal of a switch 53 which forms a further input E2, so that this embodiment of a read/write amplifier switch can be used in the semiconductor memory array of FIG. 2.

The embodiments of FIGS. 3 and 4 can easily be modified accordingly.

Instead of the n-channel FET switches 52, 53 shown in FIG. 5, it is naturally also possible to use p-channel FET switches. The read signal R and the write signal W need merely be transposed in that case.

It is also possible to use a parallel circuit of an n-channel FET and a p-channel FET as the switch, so that the various advantages of these two variants complement one another.

Figure 6:
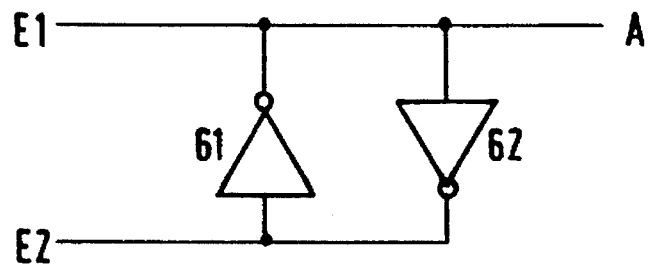

In FIG. 6, an embodiment of a read/write amplifier switch is shown of the kind that can be used in the semiconductor memory array of FIG. 2.

A parallel circuit of two oppositely acting inverter amplifiers 61, 62 is disposed between the two inputs E1 and E2, and the input E1 simultaneously forms the output A of the read amplifier switch.

Instead of the inverter amplifiers 61, 62, tri-state buffers may also be used, which can then be triggered by the read signal R or the write signal W.

However, the read signal R and the write signal W may also be used to trigger one switch each, in which case one of these switches connects the two inverter amplifiers 61, 62 to their positive supply voltage, and the other switch connects the inverter amplifiers 61, 62 to their negative supply voltage. However, given adequate power output, the read and write signals R, W may also serve directly as supply voltages for the inverter amplifiers 61, 62.

We claim:

1. An integrated semiconductor memory configuration, comprising:

a memory region having a plurality of segments, each of said memory region segments having a plurality of read amplifiers, and bit lines, each two of said bit lines being connected to a respective one of said read amplifiers;

a plurality of parallel single data lines leading to said memory region, each of said data lines having a first end proximal to and a second end distal from, a respective one of said memory region segments;

a plurality of read/write amplifier switches, one of said read/write amplifier switches being disposed at the first end of said data line proximal to and the other of said read/write amplifier switches being disposed at the second end distal from, said respective memory region segment;

data input/output circuits connected to said read/write amplifier switches disposed at the second ends of said data lines distal from said memory region segments; and selector switches each connecting one of said read/write amplifier switches disposed on the first end of a respective one of said data lines oriented toward said memory region segment to a respective one of said read amplifiers of said memory region segment.

2. The integrated semiconductor memory configuration according to claim 1, including a circuit configuration for further processing data connected between said read/write amplifier switches and said data input/output circuits.

3. The integrated semiconductor memory configuration according to claim 2, wherein said circuit configurations for further processing data are buffer memories.

4. The integrated semiconductor memory configuration according to claim 2, wherein said circuit configurations for further processing data are shift registers.

5. The integrated semiconductor memory according to claim 2, including one connecting line connecting one of said read/write amplifier switches to one of said memory region segments, and another connecting line connecting another one of said read/write amplifier switches to one of said data input/output circuits.

6. The integrated semiconductor memory configuration according to claim 2, including two connecting lines connecting one of said read/write amplifier switches to one of said memory region segments, and another two connecting lines connecting another one of said read/write amplifier switches to one of said data input/output circuits.

* * * * *